US006327292B1

(12) United States Patent
Sanchez-Rubio et al.

(10) Patent No.: US 6,327,292 B1
(45) Date of Patent: Dec. 4, 2001

(54) EXTERNAL CAVITY LASER SOURCE USING SPECTRAL BEAM COMBINING IN TWO DIMENSIONS

(75) Inventors: Antonio Sanchez-Rubio, Lexington; Tso Yee Fan, Belmont, both of MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/337,081

(22) Filed: Jun. 21, 1999

Related U.S. Application Data

(63) Continuation-in-part of application No. 09/149,610, filed on Sep. 8, 1998.

(51) Int. Cl.[7] .................................................. H01S 3/08
(52) U.S. Cl. ............................ 372/92; 372/98; 372/102; 372/43; 372/108
(58) Field of Search ................................ 372/43, 92, 98, 372/102, 108, 9, 23

(56) References Cited

U.S. PATENT DOCUMENTS

| | | | |
|---|---|---|---|
| 4,923,270 | 5/1990 | Carter | 350/96.18 |
| 5,115,444 | 5/1992 | Kirby et al. | 372/50 |
| 5,163,058 | 11/1992 | Farries et al. | 372/6 |
| 5,351,262 | * 9/1994 | Poguntke et al. | 372/102 |
| 5,379,310 | * 1/1995 | Papen et al. | 372/92 |
| 6,192,062 | * 2/2001 | Sanchez-Rubio et al. | 372/92 |
| 6,208,679 | * 3/2001 | Sanchez-Rubio et al. | 372/92 |

OTHER PUBLICATIONS

M.C. Farries et al., "Tuneable Multiwavelength Semiconductor Laser with Single Fibre Output" *Electronics Letters* 27(17):1498–1499 (1991).

K.R. Poguntke et al.,"Simultaneous Multiple Wavelength Operation of a Multistripe Array Grating Integrated Cavity Laser" *Applied Physics Letters* 62:2024–2026 (1993).

* cited by examiner

*Primary Examiner*—Leon Scott, Jr.
(74) *Attorney, Agent, or Firm*—Testa, Hurwitz & Thibeault, LLP

(57) ABSTRACT

A free space external cavity multi-wavelength laser that includes a free space external cavity and a two-dimensional laser array is described. The two-dimensional laser array includes a plurality of optical gain elements where each optical gain element generates optical radiation having a unique wavelength and a unique free space optical path. The laser also includes a two-dimensional dispersive optical system that spatially and angularly overlaps each of the free space optical paths in two dimensions. The laser also includes a partially reflecting element that is positioned to intercept each of the free space optical paths. The partially reflecting element, a reflector on each gain element, and the two-dimensional dispersive optical system together form a free space laser cavity that defines the unique wavelengths. The partially reflecting element transmits an overlapping beam comprising radiation having the unique wavelengths.

24 Claims, 5 Drawing Sheets

EXTERNAL CAVITY LASER SOURCE USING SPECTRAL BEAM COMBINING IN TWO DIMENSIONS

RELATED APPLICATIONS

This is a continuation-in-part of patent application Ser. No. 09/149,610, filed Sep. 8, 1998, the entire disclosure of which is incorporated herein by reference.

GOVERNMENT SUPPORT

This invention was made with government support under Contract Number F19628-95-C-0002 awarded by the U.S. Air Force. The government has certain rights in the invention.

FIELD OF THE INVENTION

The invention relates generally to the field of external cavity laser sources. In particular, the invention relates to efficient high-power or high-brightness, multi-wavelength external cavity laser sources that use two-dimensional laser arrays and to methods of generating a high-power or high-brightness multi-wavelength overlapping or coaxial optical beam using a two dimensional laser array.

BACKGROUND OF THE INVENTION

High-power or high-brightness semiconductor laser sources which have high efficiency are required for a variety of applications including machining, laser pumping and numerous medical procedures. Efficient high brightness semiconductor laser sources are typically achieved by focusing a semiconductor laser beam into an optical fiber having a small etendue (i.e. small product of core diameter and numerical aperture of the fiber).

Prior methods of fiber coupling high-power diode laser arrays, however, require the use of highly multi-mode optical fiber (i.e. large etendue) and, therefore, have relatively low brightness. For example, one commercial product generates 30 Watts of output power from a multi-mode fiber with a core diameter of about 1 mm and a numerical aperture of 0.12.

Numerous other applications require high-power or high-brightness sources. These applications include communications, solid state laser pumping, imaging, printing, and optical switching. Relatively low-power, multi-wavelength integrated and external cavity lasers have been constructed using dispersive elements.

U.S. Pat. No. 5,351,262 to Poguntke et al. describes a multi-wavelength laser having an integrated cavity that is formed on a single substrate. The laser includes a plurality of individually selectable active waveguides, a diffraction grating, and a passive output waveguide. A resonant cavity is formed between the selected active stripe, the diffraction grating, and the passive output waveguide. The geometry of the resonant cavity determines the lasing wavelengths of each of the plurality of active waveguides. The Poguntke laser can only be used to generate relatively low powers because it is integrated on a monolithic substrate and thus has limited heat dissipation.

Farries, et al., *Tunable Multiwavelength Semiconductor Laser with Single Fibre Output*, Electronic Letters, Vol. 27, No. 17, Aug. 15, 1991, describes a low-power multi-wavelength external cavity laser that uses a diffraction grating. The external cavity comprises a monolithic semiconductor laser array, a diffraction grating, and a single mode fiber loop mirror. The loop mirror includes a 50:50 coupler with two output ports that are fusion spliced to form a Sagnac interferometer.

Because the Farries laser is designed for fiber optic communication systems, it comprises a single mode semiconductor laser array and, therefore, it can only be used to generate relatively low powers. In Farries, the element separation in the semiconductor laser array is only ten microns. The resulting output power into the fiber is only approximately 0.5 mW per element. In addition, because the Farries laser is not completely a free space laser cavity, it is relatively inefficient.

U.S. Pat. No. 5,115,444 to Kirkby et al. describes a multi-wavelength external cavity and integrated cavity laser that uses a dispersive element. A set of optical cavities having different frequency bands is formed from a set of individually addressable semiconductor laser amplifiers, each having a single reflecting facet. The cavity includes a common dispersive element and a common semiconductor amplifier having a partially reflecting facet. The Kirkby laser can only be used to generate relatively low powers. The Kirkby integrated cavity laser is formed on a monolithic substrate and thus has limited heat dissipation. The Kirkby external cavity laser uses a common semiconductor amplifier through which all optical beams in the cavity must propagate. Because the common amplifier also has limited heat dissipation, the Kirkby external cavity laser can only generate relatively low power.

U.S. Pat. No. 5,379,310 to Papen et al. describes an external cavity multi-wavelength laser that uses a dispersive element. A cavity is formed from a plurality of semiconductor lasers, a dispersive element and a reflective element. The plurality of semiconductor lasers generates a plurality of optical beams which are deflected by the dispersive element onto the reflective element. The combination of the dispersive element and the curved surface imposes a different resonance condition on each semiconductor laser thereby resulting in each laser lasing at a different wavelength. The Papen laser generates a plurality of parallel output beams; each beam having a different wavelength. The Papen laser is designed for relatively low power applications such as communication systems, data storage, and spectroscopy. Because the Papen laser generates a parallel (not overlapping or coaxial) output beam, it has relatively low brightness.

U.S. Pat. No. 4,923,270 to Carter describes a laser source for optical wavelength multiplexing. The laser source includes an optical assembly and a reflection grating for collimating light emitted by a laser and for refocussing the light onto an output waveguide. The output waveguide is a fiber that incorporates an embedded reflector which is displaced from the end of the fiber. Because the cavity of the laser source is not a completely free space laser cavity, the power, efficiency, and brightness of the laser is limited.

SUMMARY OF THE INVENTION

It is therefore a principal object of this invention to provide a high-power or high-brightness, multi-wavelength semiconductor or fiber laser source that uses one and two-dimensional laser arrays and that generates an overlapping or coaxial beam. It is another principle object of this invention to couple such a source into an optical fiber.

A principal discovery of the present invention is that a high-power or high-brightness, multi-wavelength external cavity laser that generates an overlapping or coaxial beam can be constructed with an optical fiber or a semiconductor gain media (single mode or multi-mode), a wavelength dispersive element, and a partially reflecting element. Another principal discovery of the present invention is that a high-power or high-brightness, multi-wavelength external cavity laser that generates an essentially symmetric beam can be constructed by beam combining a two-dimensional laser array using a two-dimensional dispersive optical system.

Accordingly, in one embodiment, the present invention features a high-power, external cavity laser source. At least two optical gain media are positioned in the cavity. Each gain element generates optical radiation having one of at least a first and a second wavelength and one of at least a first and a second free space optical path, respectively.

An optical element is positioned in the cavity such that its focal plane is approximately located at the at least two optical gain media and such that it intercepts the at least two respective free space optical paths. The optical element may comprise a refractive or a reflective element. A dispersive element is positioned in the at least two optical paths. In one embodiment, the dispersive element comprises a grating. In another embodiment, the optical element and the dispersive element comprise a single optical element such as a Rowland-circle grating.

Another aspect of this invention is the use of a free space external cavity with no guided-wave elements. Free space cavities are inherently less lossy than those that include guided wave elements, and therefore will be more efficient. In addition, free space external cavities are simpler.

A partially reflecting element is also positioned in the at least two optical paths. In one embodiment, the partially reflecting element comprises an end face of an optical fiber. The partially reflecting element and the gain media together form a free space laser cavity that defines the at least first and second wavelength. In operation, the partially reflecting element transmits an overlapping or coaxial beam comprising radiation having the at least first and second wavelength.

The present invention also features a multi-wavelength, free space external cavity laser source. At least two optical fiber gain media are positioned in at least two respective free space optical paths. Each gain media generates optical radiation having one of at least a first and a second wavelength, respectively. Each of the at least two optical fiber gain media may generate at least substantially 0.5 Watt of optical radiation.

An optical element is positioned in the cavity such that its focal plane is substantially located at the at least two optical gain media and such that it intercepts the at least two respective free space optical paths. The optical element may comprise a refractive or a reflective element. A dispersive element is positioned in the at least two optical paths. The dispersive element may comprise a grating. In one embodiment, the optical element and the dispersive element comprise a single optical element such as a Rowland-circle spectrometer grating.

A partially reflecting element is also positioned in the at least two optical paths. In one embodiment, the partially reflecting element comprises an end face of an optical fiber. The partially reflecting element and the gain media together form a free space laser cavity that defines the at least first and second wavelength. In operation, the partially reflecting element transmits an overlapping or coaxial beam comprising radiation having the at least first and second wavelength.

The present invention also features a free space external cavity multi-wavelength laser that includes a free space external cavity and a two-dimensional laser array. The two-dimensional laser array includes a plurality of optical gain elements where each optical gain element generates optical radiation having a unique wavelength and a unique free space optical path. At least one of the optical gain elements may comprise a multimode gain element that generates multi-mode optical radiation. In one embodiment, the two-dimensional laser array is a fiber laser array. In another embodiment, the two-dimensional laser array comprises at least two linear semiconductor laser arrays positioned vertically in a plane perpendicular to a junction of the gain elements. In another embodiment, the two-dimensional laser array comprises a two-dimensional surface emitting semiconductor laser array. The gain elements need not be identical. For example, semiconductor gain elements may be composed of different alloys.

The laser also includes a two-dimensional dispersive optical system that spatially and angularly overlaps each of the free space optical paths in two dimensions, i.e., forces the optical paths to co-propagate. The two-dimensional dispersive optical system includes an optical system and a two-dimensional dispersive system. In one embodiment of the invention, the optical system and the two-dimensional dispersive system comprise a single element. The optical system is positioned to substantially place its focal plane at the locations of each of the optical gain elements and to intercept each of the free space optical paths. The optical system may include a refractive or a reflective element.

The two-dimensional dispersive system is positioned substantially at the focal plane of the optical system and is positioned to intercept each of the free space optical paths. In another embodiment, the two-dimensional dispersive system comprises a two-dimensional diffractive optical element. In another embodiment, the two-dimensional dispersive system includes a low-order grating, a high-order grating and a relay imaging system that optically couples the low-order blazed grating to the high-order grating. The low-order grating may comprise a blazed grating. The high-order grating may comprises an echelle grating, and the relay imaging system may comprise a telescope.

The laser also includes a partially reflecting element that is positioned to intercept each of the free space optical paths. In one embodiment, the partially reflecting element comprises an end face of an optical fiber. The partially reflecting element, a reflector on each gain element, and the two-dimensional dispersive optical system together form a free space laser cavity that defines the unique wavelengths for each array element. The partially reflecting element transmits an overlapping beam comprising radiation having the unique wavelengths. The overlapping beam may be an essentially symmetric beam.

In one embodiment, an optical fiber is optically coupled to the partially reflecting element. The optical fiber may have an etendue substantially greater than $N\lambda/\pi$, where N is a beam quality factor and $\lambda$ is the optical wavelength, so that substantially all power emitted from the partially reflecting element is coupled into the optical fiber.

BRIEF DESCRIPTION OF THE DRAWINGS

This invention is described with particularity in the appended claims. The above and further advantages of this invention may be better understood by referring to the following description taken in conjunction with the accompanying drawings, in which:

FIG. 5b illustrates the dependence of the diffracted transverse k-vector as a function wavelength in k-space for the two-dimensional dispersive system described in connection with FIG. 5a.

DETAILED DESCRIPTION

Figure 1:
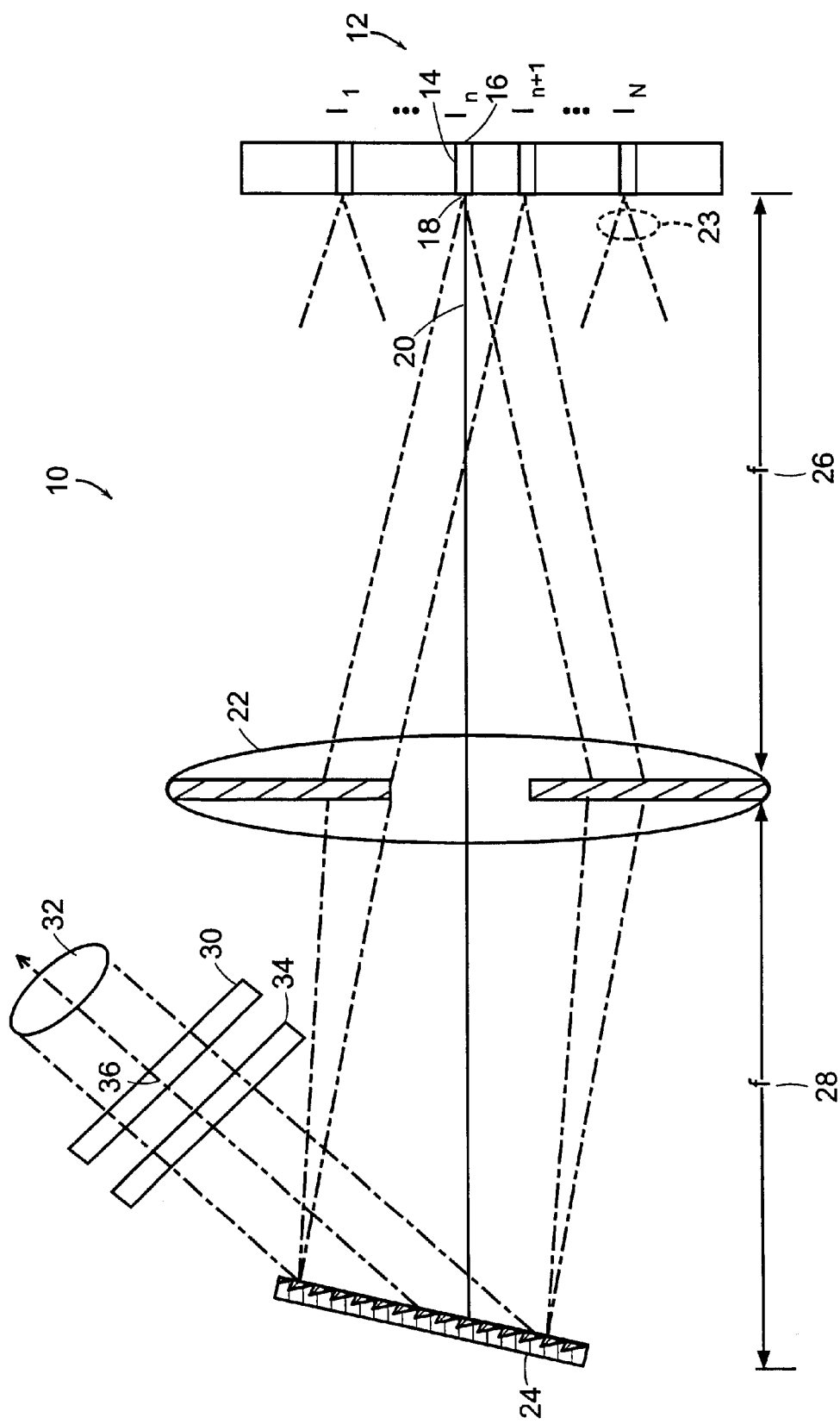
FIG. 1 illustrates a schematic diagram of an embodiment of a multi-wavelength external cavity laser according to the present invention.

FIG. 1 illustrates a schematic diagram of an embodiment of a multi-wavelength external cavity laser 10 according to the present invention. The laser 10 includes a plurality of optical gain media 12. The gain media 12 may be positioned on equal or unequal center-to-center spacing. Positioning the gain media 12 on unequal spacing may reduce cross talk between the gain media 12. Each of the gain media may be substantially the same or different gain media. Any optical gain media may be used. The gain media 12 must, however, have sufficient gain and sufficient gain bandwidth to overcome optical losses at the desired lasing wavelengths.

In one embodiment, the gain media 12 comprise a linear array of multi-mode semiconductor laser amplifiers having stripes 14 of active gain media. In another embodiment, the gain media 12 comprise a plurality of discrete multi-mode semiconductor amplifiers. In yet another embodiment, the gain media 12 comprise a plurality of fiber amplifiers.

Each gain media 12 has a reflecting rear face 16 and a substantially antireflective front face 18. In one embodiment, the rear face 16 is substantially totally reflecting. Each of the gain media 12 emit a beam of radiation in different optical paths 20. An optical element, such as a collimating lens 22, is positioned in the optical paths 20 of the beams. In one embodiment, additional collimating lenses 23 are positioned adjacent to the front face 18 of each gain media 12. In one embodiment, the optical element comprises a curved mirror.

A dispersive element, such as a diffraction grating 24, is also positioned in the optical paths 20. In one embodiment, the lens 22 is positioned at substantially a focal length 26 away from the gain media 12 and the grating 24 is positioned at substantially a focal length 28 away from the lens 22.

A partially reflective element 30, such as a partial mirror 30, is positioned in the optical paths 20 so that it reflects the optical beams at near normal incidence. The partial mirror 30 reflects a portion of the beams emitted by the gain media 12 back into the optical paths 20. The partial mirror 30 also transmits a portion of the optical beams emitted by the gain media 12 out of the laser 10 as an overlapping or coaxial output beam 32.

In one embodiment, a spatial filter 34 is positioned between the grating 24 and the partial mirror 30. The spatial filter 34 may comprise a lens positioned at substantially a focal length from an aperture 36 at the partial mirror 30. Typically the aperture 36 is partially reflective and is dimensioned such that it is substantially the dimensions of the image of one of the gain media 12. The surface of the partial mirror surrounding the aperture 36 may be absorbing, scattering or transmissive. In operation, the spatial filter 34 passes only those rays that are at near normal incidence to the spatial filter 34. This eliminates cross talk between the gain media 12.

A resonator is formed by the reflecting surface of the rear face 16 of each of the gain media 12 and the partial mirror 30. The optical paths 20 of the laser 10 all pass through lens 22 and are all dispersed by grating 24. That is, the optical paths 20 all share lens 22 and grating 24 but pass through only one of the plurality of semiconductor gain media 12. The overlapping or coaxial output beam 32 propagates normal to the partially reflecting mirror.

A method of generating high-power optical radiation using the external cavity laser source of the present invention includes providing a free space external cavity. The cavity includes at least two optical gain media at one end of the cavity and a partially reflecting element at the other end of the cavity. An optical element and a dispersive element are positioned in the optical paths of the cavity.

The gain media 12 are pumped with energy which is typically provided by electrical current or optical radiation. The gain media each generate optical beams having one of at least a first and a second wavelength and one of at least a first and a second free space optical path, respectively. Each of the gain media may generate at least 0.5 Watt of multi-mode optical radiation.

The pumped gain media and the partially reflecting element together form an ensemble of individual external cavity lasers, each with its own gain media and optical path. An output beam comprising radiation having the at least first and second wavelength is transmitted through the partially reflecting element. The output beam is overlapping or coaxial in shape because all of the optical beams travel through the optical element such that their paths intercept at the location of the dispersive element and have a common path on the partial mirror 30 side of the dispersive element.

Since each of these individual external cavity lasers has its beam incident on the dispersive element at a different angle, each of the external cavity lasers has a different optical path and, therefore, each external cavity laser lases at a different wavelength. The wavelengths generated by each laser are a function of the center-to-center spacing of the gain media and the properties of the dispersive element. The center-to-center spacing of the gain media may be constant or variable. The wavelengths are tunable. One method of tuning the wavelengths of the lasers is to slightly tilt the partially reflecting element. This changes the angle of incidence of the optical beams on the dispersive element and thus changes the optical path lengths.

Another method of tuning the wavelengths of the external cavity lasers is to translate the gain element sideways (up and down in figure). This also changes the angle of incidence of the optical beams on the grating and thus changes the optical path length. Tuning the wavelengths of lasers by translating the gain element sideways is advantageous because translating the gain media does not translate the output beam.

The tuning range depends on the gain bandwidth of the gain media and the reflectivity presented by the partially reflecting element. The number of gain media and their location can be chosen so as to generate simultaneously or sequentially any set of wavelengths within the gain width of the gain media.

Figure 2:
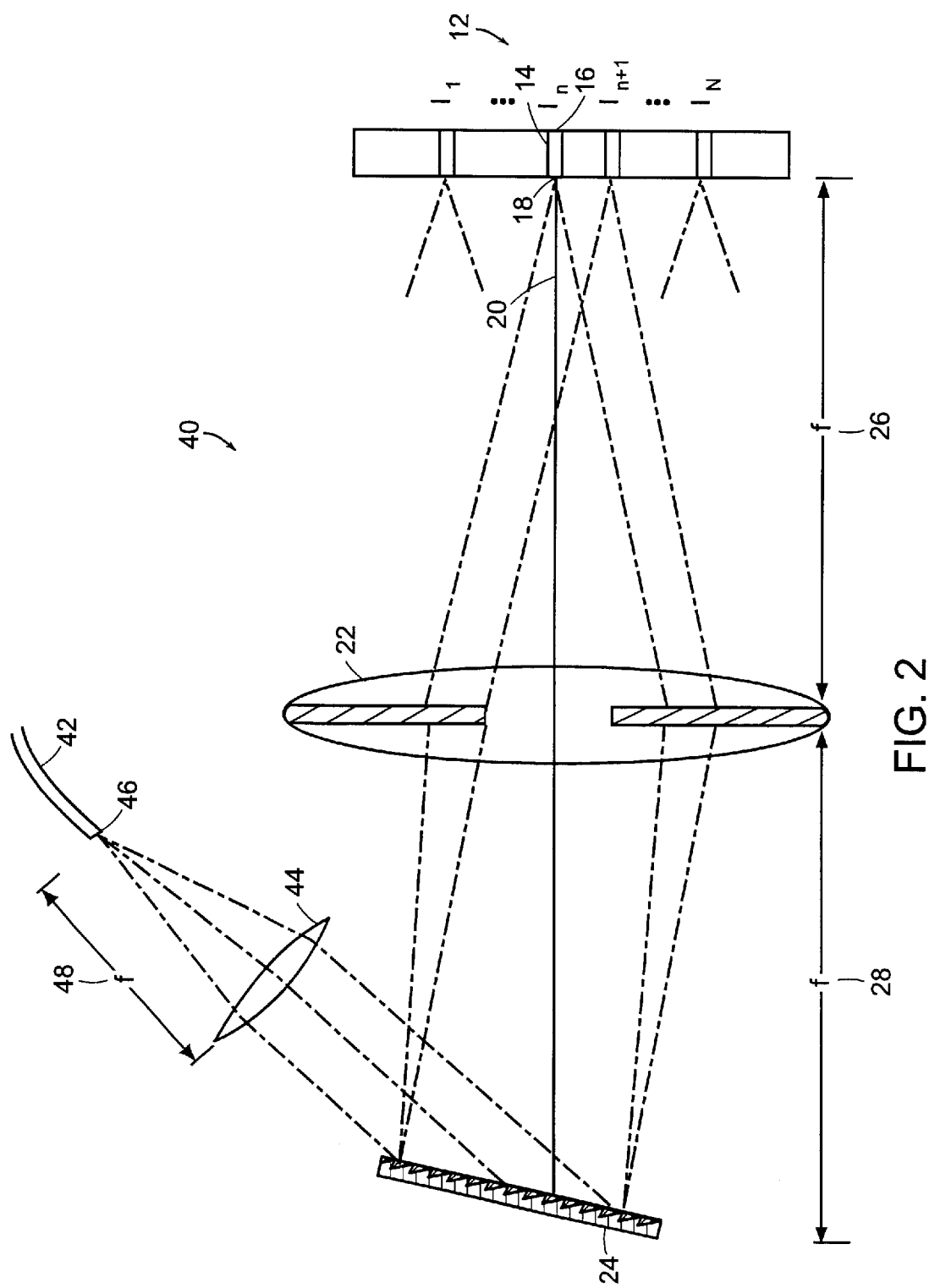
FIG. 2 illustrates a schematic diagram of an embodiment of a multi-wavelength external cavity laser according to the present invention that couples a high-power semiconductor laser source into an optical fiber.

FIG. 2 illustrates a schematic diagram of an embodiment of a multi-wavelength external cavity laser according to the present invention that couples a high-power semiconductor laser array into an optical fiber 42. The laser 40 of FIG. 2 is similar to the laser 10 of FIG. 1. The partial mirror 30 of FIG. 1 is replaced by a lens 44 which focuses the beams generated by gain media 12 onto a partially reflecting end face 46 of the optical fiber 42. A resonator is formed by the reflecting surface of the rear face 16 of each of the gain media 12 and the partially reflective end face 46 of the optical fiber 42. The optical fiber 42 is positioned a distance that is substantially equal to a focal length 48 away from the lens 44. The lens 44 is designed to focus the output beam into an angle that does not exceed the numerical aperture of the fiber 42.

Figure 3:
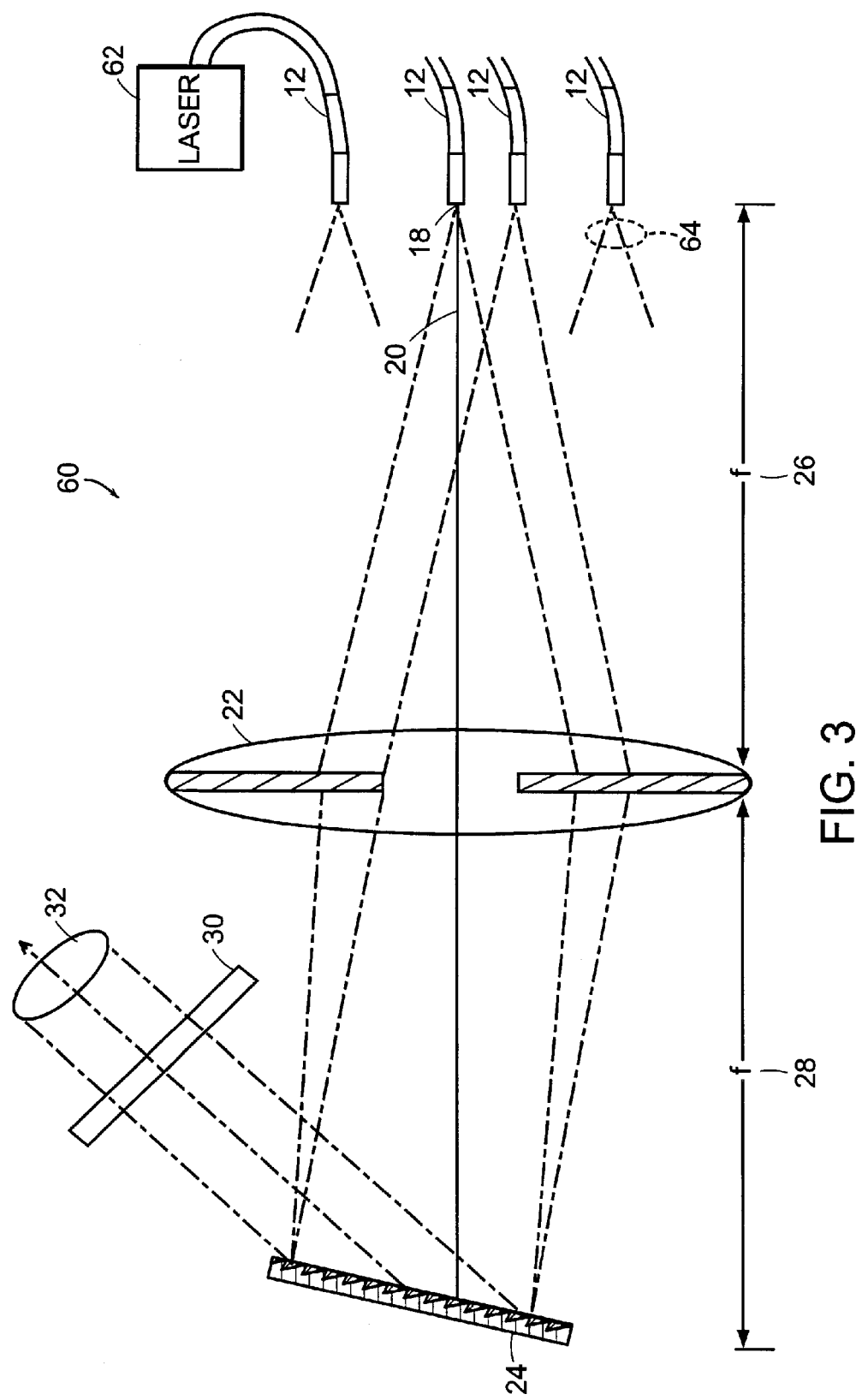
FIG. 3 illustrates a schematic diagram of an embodiment of a multi-wavelength external cavity laser according to the present invention that uses fiber amplifier gain media.

FIG. 3 illustrates a schematic diagram of an embodiment of a multi-wavelength external cavity laser according to the present invention that uses fiber amplifier gain media 12. The laser 60 of FIG. 3 is similar to the laser 10 of FIG. 1. The gain media 12 comprise a plurality of fiber amplifiers. In operation, the fiber amplifiers are optically pumped by a pump laser 62. In one embodiment, focusing lenses 64 are positioned adjacent to the output of each of the fibers.

The present invention teaches a high-power or high-brightness, multi-wavelength semiconductor or fiber laser that generates an overlapping or coaxial beam that can be coupled into an optical fiber. The laser can be constructed with a semiconductor or fiber gain media, a wavelength dispersive element, and a partially reflecting element.

The present invention also features an external cavity laser source that uses spectral beam combining in two-dimensions. Such a laser source can produce a substantially symmetric optical beam with high brightness.

Figure 4:
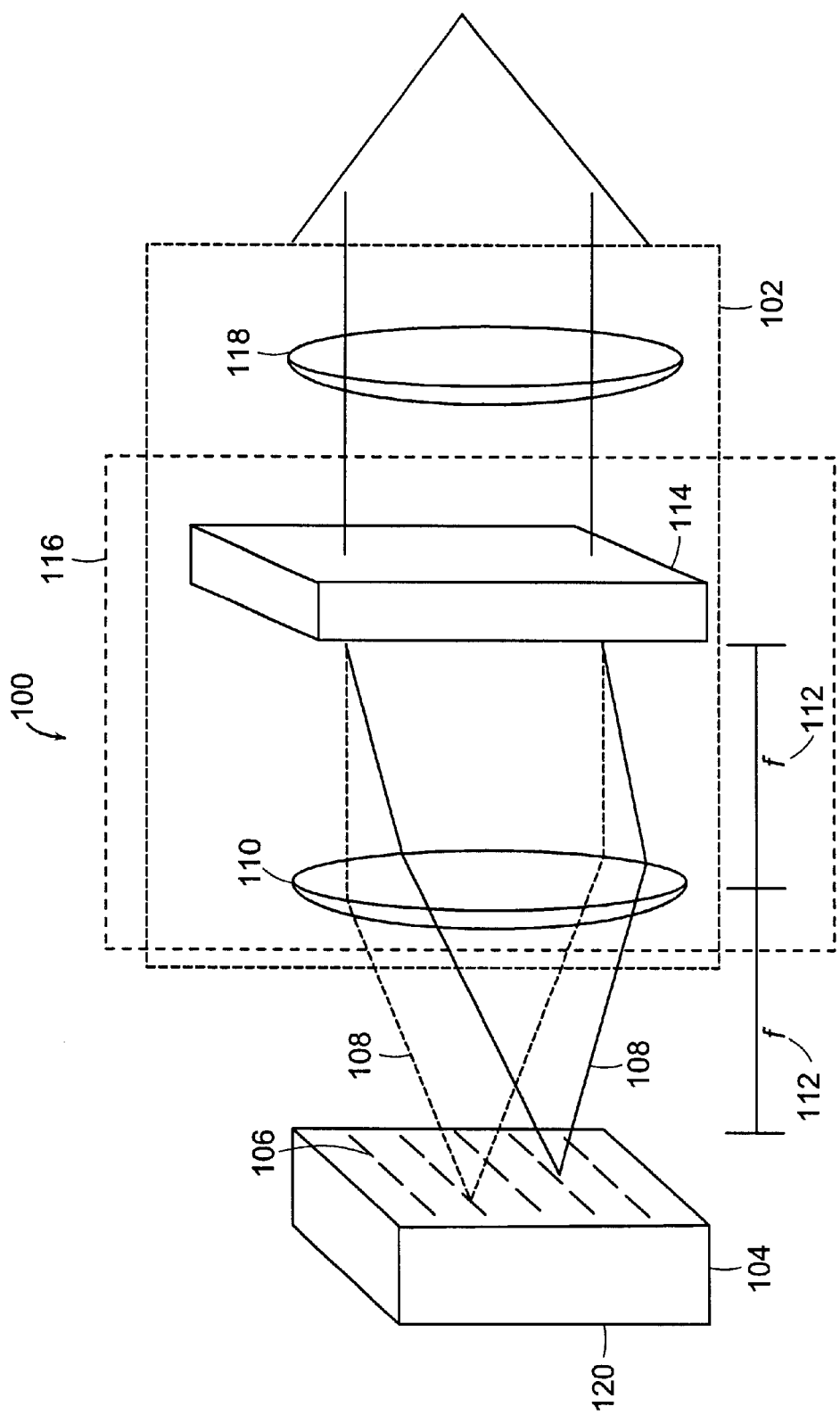
FIG. 4 illustrates an embodiment of an external cavity laser source that uses spectral beam combining in two-dimensions according to the present invention.

FIG. 4 illustrates an embodiment of an external cavity laser source 100 that uses spectral beam combining in two-dimensions according to the present invention. The laser source comprises a free space laser cavity 102. The laser cavity includes a two-dimensional laser array 104 having a plurality of optical gain elements 106 where each optical gain element generates optical radiation having a unique wavelength and a unique free space optical path 108. The gain elements 106 may be single mode or may be multi-mode.

In one embodiment, the two-dimensional laser array 104 comprises a fiber laser array. In another embodiment, the two-dimensional semiconductor laser array 104 comprises at least two linear semiconductor laser arrays positioned vertically in a plane perpendicular to a junction of the gain elements in a rack-and-stack configuration. In yet another embodiment, the two-dimensional laser array 104 comprises a two-dimensional surface emitting laser array.

A two-dimensional dispersive optical system 116 spatially and angularly overlaps the unique free space optical paths 108 so that they copropagate and are substantially coaxial. In one embodiment, the two-dimensional dispersive optical system 116 comprises an optical system 110 and a two-dimensional dispersive system 114. The optical system 110 is positioned approximately a focal length 112 away from the two-dimensional laser array 104 so that the optical system 110 intercepts each of the unique free space optical paths 108. In one embodiment, the optical system 110 comprises a lens. In another embodiment, the optical system 110 comprises a curved mirror.

A two-dimensional dispersive system 114 is positioned substantially at a distance corresponding to the focal length 112 of the optical system 110. The two-dimensional dispersive optical system 114 spatially and angularly overlaps each of the unique free space optical paths 108 in two dimensions. In one embodiment, the two-dimensional dispersive optical system 114 comprises a two-dimensional diffractive optical element.

In another embodiment, the two-dimensional dispersive system 114 includes a low-order grating, a high-order grating and a relay imaging system that optically couples the low-order blazed grating to the high-order grating as described in FIG. 5. In one embodiment, the optical system 110 and the two-dimensional dispersive system 114 comprise a single optical element.

A partially reflecting element 118 is positioned to intercept each of the unique free space optical paths 108. In one embodiment, the partially reflecting element comprises an end face of an optical fiber (not shown). A plurality of external cavity laser resonators, each having a unique wavelength, are formed by a reflector 120 on the end of or adjacent to each optical gain elements 106, the two-dimensional dispersive optical system 116, and the partially reflecting element 118.

In operation, each of the plurality of gain elements 106 generates a beam of single mode or multi-mode optical radiation having a unique free space optical path and a unique wavelength. The optical system 110 directs each of the optical beams at different angles into the two-dimensional dispersive system 114. The beams are overlapped at an entrance to the two-dimensional dispersive system 114 since it is positioned approximately at a focal length from the optical system 110. The two-dimensional dispersive system 114 diffracts the beams in two-dimensions as the wavelength is varied.

The diffracted optical beams are directed to the partially reflecting element 118 in a common optical path, since the two dimensional dispersive optical system 114 is positioned approximately at a focal length 112 from the optical system 110. The partially reflecting element transmits an overlapping beam comprising radiation having the unique wavelengths. The overlapping beam may be an essentially symmetric beam.

The present invention also features a method of combining light beams generated by a two-dimensional laser array. The method includes forming a free space external cavity in the following way. A plurality of optical radiation beams is generated with a two-dimensional laser array having a plurality of optical gain elements where each of the optical radiation beams has a unique wavelength and a unique free space optical path. The plurality of optical radiation beams are overlapped by, for example, reflecting or refracting the beams with an optical element.

The plurality of overlapped beams are dispersed in two-dimensions to form a plurality of beams having a common optical path. In one embodiment, the plurality of overlapped beams are dispersed substantially at a focal plane of the optical element. In one embodiment, the step of dispersing the overlapping beams in two-dimensions includes dispersing the overlapping beams with a low-order grating, relaying the dispersed overlapping beams to a high-order grating, and then dispersing the overlapping beams with a high-order grating. In another embodiment, the step of dispersing the overlapping beams in two-dimensions includes dispersing the overlapping beams with a two-dimensional dispersive element.

The plurality of beams are partially reflected with a partial reflector that is positioned in the common optical path. The partial reflector and a reflector on the gain elements together forming a free space laser cavity that defines the unique wavelengths. The plurality of beams is then partially transmitted from the free space external cavity. In one embodiment, the partially transmitted plurality of beams is coupled into an optical fiber.

Figure 5B:
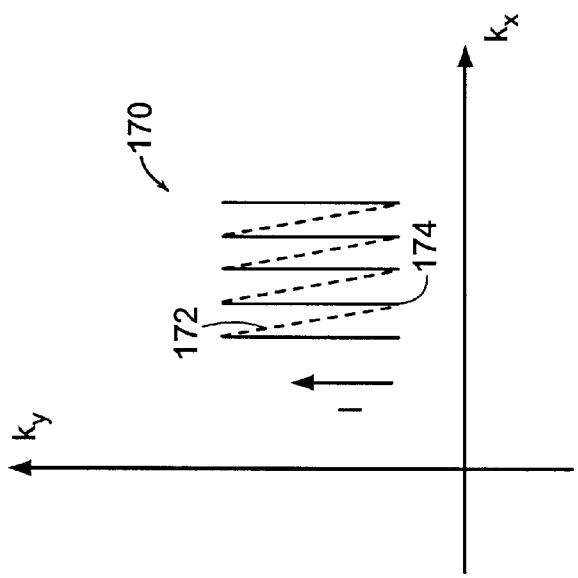
Figure 5A:
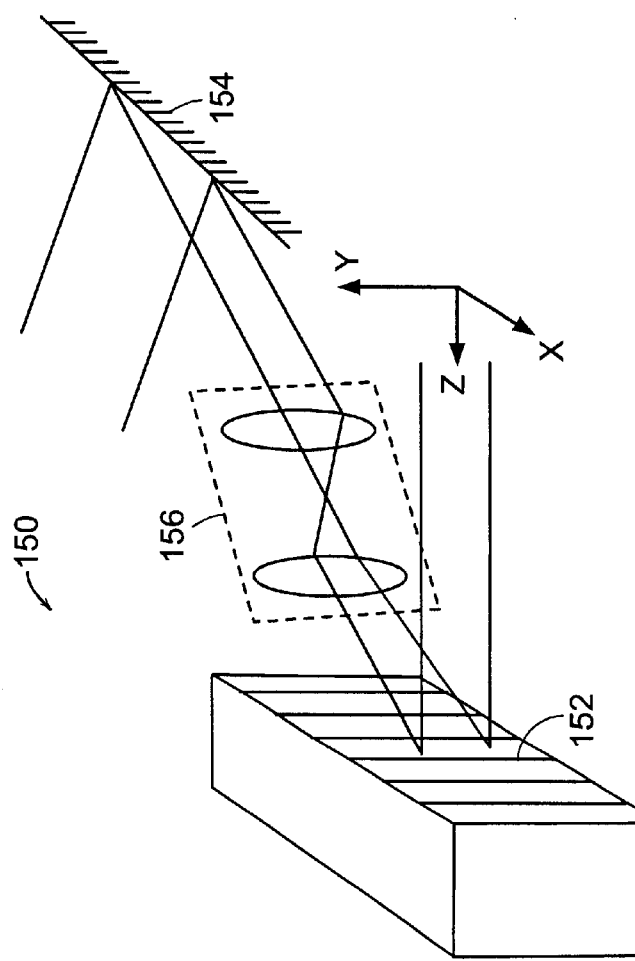
FIG. 5a illustrates an embodiment of a two-dimensional dispersive system according to the present invention that includes two crossed gratings.

FIG. 5a illustrates an embodiment of a two-dimensional dispersive system 150 according to the present invention that includes two crossed gratings. The two-dimensional dispersive system 150 includes a low-order grating 152, a high-order grating 154, and a relay imaging system 156 that optically couples the low-order grating 152 to the high-order grating 154. In one embodiment, the low-order grating 152 comprises a blazed grating, the high-order grating 154 comprises an echelle grating, and the relay imaging system 156 comprises an optical telescope.

FIG. 5b illustrates the dependence of the diffracted transverse k-vector as a function of wavelength in k-space for the two-dimensional dispersive system 150 described in connection with FIG. 5a. In FIG. 5b, the incident propagation direction where the optical beams enter into the two-dimensional dispersive system 150 is defined as the z-direction. That is, the z-direction is perpendicular to the partially reflecting element 118 (FIG. 3). Using this definition, the k-vector that describes the direction of propagation of the incident wave has $k_x = k_y = 0$. Thus, the zero-order reflections off of each grating also has $k_x = k_y = 0$.

The low-order grating 152 disperses the beam in the $K_x$ direction. The high-order grating 154 disperses the beam in the $k_y$ direction. FIG. 5b illustrates that the locus of the diffracted transverse k-vector with angle is a raster pattern 170 in which, for the embodiment shown, $k_y$ increases rapidly with wavelength $\lambda$ while $k_x$ increases more slowly. As the wavelength continues to increase, the locus in k-space will retrace 172 to low $k_y$ in the raster pattern 170.

In the embodiment of the invention where the high-order grating 154 comprises an echelle grating, the retrace 172 is not abrupt. At the ends of the retrace 174, the echelle is efficiently diffracting light into two diffraction orders simultaneously divided between low and high ends of $k_y$ (as opposed to the middle of a trace in which the echelle is diffracting light efficiently into only a single order). Therefore, the beam entering the two-dimensional dispersive system 150 from the partially reflecting element 118 is angularly dispersed in two dimensions with the angle of dispersion depending on the wavelength.

EQUIVALENTS

While the invention has been particularly shown and described with reference to specific preferred embodiments, it should be understood by those skilled in the art that various changes in form and detail may be made therein without departing from the spirit and scope of the invention as defined by the appended claims.

What is claimed is:

1. A free space external cavity multi-wavelength laser comprising:
    a) a free space external cavity comprising:
        i) a two-dimensional laser array comprising a plurality of optical gain elements, each optical gain element generating optical radiation having a unique wavelength and a unique free space optical path;
        ii) a two-dimensional dispersive optical system that spatially and angularly overlaps each of the free space optical paths in two dimensions; and
        iii) a partially reflecting element positioned to intercept each of the free space optical paths,
        wherein the partially reflecting element, a reflector on or adjacent to each gain element and the two-dimensional dispersive optical system together forming a free space laser cavity that defines the unique wavelengths, and
    wherein the partially reflecting element transmits an overlapping beam comprising radiation having the unique wavelengths.

2. The laser of claim 1 wherein the two-dimensional dispersive optical system comprises:
    a) an optical system having a focal plane, the optical system positioned to substantially place the focal plane at the locations of each of the optical gain elements and to intercept each of the free space optical paths; and
    b) a two-dimensional dispersive system positioned to intercept each of the free space optical paths.

3. The laser of claim 2 wherein the optical system comprises refractive or reflective elements.

4. The laser of claim 2 wherein the two-dimensional dispersive system is positioned substantially at the focal plane of the optical system.

5. The laser of claim 2 wherein the two-dimensional dispersive system comprises:
    a) a low-order blazed grating;
    b) a high-order grating; and
    c) a relay imaging system that optically couples the low-order blazed grating to the high-order echelle grating.

6. The laser of claim 5 wherein the relay imaging system comprises a telescope.

7. The laser of claim 5 wherein the high-order grating comprises an echelle grating.

8. The laser of claim 2 wherein the two-dimensional dispersive system comprises a two-dimensional diffractive element.

9. The laser of claim 2 wherein the optical system and the two-dimensional dispersive system comprises a single element.

10. The laser of claim 1 wherein the two-dimensional laser array comprises a fiber laser array or a semiconductor laser array.

11. The laser of claim 1 wherein at least one of the optical gain elements comprises a multi-mode gain element that generates multi-mode optical radiation.

12. The laser of claim 1 wherein the overlapping beam comprises an essentially symmetric beam.

13. The laser of claim 1 further comprising an optical fiber that is optically coupled to the partially reflecting element.

14. The laser of claim 13 wherein the optical fiber comprises an etendue substantially greater than $N\lambda/\pi$, where N is a beam quality factor and $\lambda$ is the optical wavelength, thereby coupling substantially all power emitted from the partially reflecting element into the optical fiber.

15. The laser of claim 1 wherein the two-dimensional laser array comprises at least two linear semiconductor laser arrays positioned vertically in a plane perpendicular to a junction of the gain elements.

16. The laser of claim 1 wherein the partially reflecting element comprises an end face of an optical fiber.

17. A method of combining light beams generated by a two-dimensional laser array, the method comprising:
    a) forming a free space external cavity by:
        i) generating a plurality of optical radiation beams with a two-dimensional laser array comprising a plurality of optical gain elements, each beam having a unique wavelength and a unique free space optical path;
        ii) overlapping the plurality of optical radiation beams in two dimensions with an optical system;
        iii) dispersing the plurality of overlapping beams in two-dimensions to form a plurality of beams having a common optical path; and iv) partially reflecting the plurality of beams with a partial reflector positioned in the common optical path, the partial reflector and a reflector of the gain elements together forming a free space laser cavity that defines the unique wavelengths, and b) partially transmitting the plurality of beams from the free space external cavity.

18. The method of claim 17 wherein the steps of overlapping the plurality of optical radiation beams and dispersing the plurality of overlapping beams comprises overlapping the beams with a single optical element.

19. The method of claim 17 further comprising the step of coupling the partially transmitted plurality of beams into an optical fiber.

20. The method of claim 17 wherein the step of overlapping the plurality of optical radiation beams with an optical system comprises reflecting the free space optical paths.

21. The method of claim 17 wherein the step of overlapping the plurality of optical radiation beams with an optical system comprises the step of refracting the free space optical paths.

22. The method of claim 17 wherein the step of dispersing the overlapping beams in two-dimensions comprises the step of dispersing the overlapping beams substantially at a focal plane of the optical system.

23. The method of claim 17 wherein the step of dispersing the overlapping beams in two-dimensions comprises dispersing the overlapping beams with a two-dimensional dispersive element.

24. The method of claim 17 wherein the step of dispersing the overlapping beams in two-dimensions comprises the steps of:

a) dispersing the overlapping beams with a low-order grating;

b) relaying the dispersed overlapping beams to a high-order grating; and c) dispersing the overlapping beams with a high-order grating.

* * * * *